US012765321B2

(12) United States Patent
Bertrand et al.

(10) Patent No.: US 12,765,321 B2
(45) Date of Patent: Oct. 13, 2026

(54) CARRIER SUBSTRATE FOR SOI STRUCTURE AND ASSOCIATED MANUFACTURING METHOD

(71) Applicant: Soitec, Bernin (FR)

(72) Inventors: Isabelle Bertrand, Bernin (FR); Frédéric Allibert, Bernin (FR); Romain Bouveyron, Bernin (FR); Walter Schwarzenbach, Bernin (FR)

(73) Assignee: Soitec, Bernin (FR)

( * ) Notice: Subject to any disclaimer, the term of this patent is extended or adjusted under 35 U.S.C. 154(b) by 700 days.

(21) Appl. No.: 18/004,156

(22) PCT Filed: Mar. 30, 2021

(86) PCT No.: PCT/FR2021/050560
§ 371 (c)(1),
(2) Date: Jan. 3, 2023

(87) PCT Pub. No.: WO2022/003262
PCT Pub. Date: Jan. 6, 2022

(65) Prior Publication Data

US 2023/0317496 A1 Oct. 5, 2023

(30) Foreign Application Priority Data

Jul. 3, 2020 (FR) ....................................... 2007096

(51) Int. Cl.
*H10P 36/20* (2026.01)
*H10D 86/00* (2025.01)
(Continued)

(52) U.S. Cl.
CPC .......... *H10P 72/74* (2026.01); *H10D 86/201* (2025.01); *H10P 95/90* (2026.01)

(58) Field of Classification Search
CPC ............... H01L 21/6835; H01L 21/324; H01L 21/02002; H01L 21/3247; H01L 21/3226;
(Continued)

(56) References Cited

U.S. PATENT DOCUMENTS 5,502,331 A * 3/1996 Inoue ..................... H10D 62/83
257/E21.321
8,436,363 B2 5/2013 Werkhoven et al.
(Continued)

FOREIGN PATENT DOCUMENTS

EP 1713121 A2 * 10/2006 ............ C30B 29/06
FR 2977069 B1 12/2012
(Continued)

OTHER PUBLICATIONS

International Search Report for International Application No. PCT/FR2021/050718 dated Jun. 25, 2021, 2 pages.
(Continued)

*Primary Examiner* — Marlon T Fletcher
*Assistant Examiner* — Sesha Sairaman Srinivasan
(74) *Attorney, Agent, or Firm* — TraskBritt

(57) ABSTRACT

A carrier substrate comprises monocrystalline silicon, and has a front face and a back face. The carrier substrate comprises:

a surface region extending from the front face to a depth of between 800 nm and 2 microns, having less than 10 crystal-originated particles (COPs) (as detected by inspecting the surface using dark-field reflection microscopy);

an upper region extending from the front face to a depth of between a few microns and 40 microns and having an interstitial oxygen (Oi) content less than or equal to 7.5E17 Oi/cm$^3$ and a resistivity higher than 500 ohm·cm, and (Continued)

a lower region extending between the upper region and the back face and having a micro-defect (BMD) concentration greater than or equal to 1E8/cm$^3$.

A method is used to manufacture such a carrier substrate.

13 Claims, 3 Drawing Sheets

(51) Int. Cl.
*H10P 72/70* (2026.01)
*H10P 90/00* (2026.01)
*H10P 95/90* (2026.01)

(58) Field of Classification Search
CPC .......... H01L 21/76254; H01L 21/3225; H10D 86/201; H10P 72/74; H10P 95/90; H10P 90/1916; H10P 95/906; H10P 36/07; H10P 36/20; H10P 90/00; H10W 10/181
See application file for complete search history.

(56) References Cited

U.S. PATENT DOCUMENTS

2005/0127477 A1* 6/2005 Takase ................ H01L 21/3225 257/E21.321
2005/0196934 A1* 9/2005 Tazoe .................. H10P 90/1906 438/409
2005/0253221 A1* 11/2005 Takase .................... H10P 36/20 257/E21.321
2006/0189169 A1* 8/2006 Adachi ............... H01L 21/3225 257/E21.321
2010/0078767 A1* 4/2010 Park ....................... H10D 62/10 257/617
2011/0053350 A1* 3/2011 Watanabe ............... C30B 25/20 257/E21.318
2011/0306210 A1* 12/2011 Kashkoush ............. H10P 70/15 438/692
2016/0042974 A1 2/2016 Ono et al.
2017/0278930 A1 9/2017 Ruhl et al.
2019/0080957 A1* 3/2019 Peidous ............... H10D 62/405
2020/0020766 A1* 1/2020 Seacrist ............ H01L 21/76251

FOREIGN PATENT DOCUMENTS

JP 06-252154 A 9/1994
JP 2004-319642 A 11/2004
JP 2005-524228 A 8/2005
JP 2006-004983 A 1/2006
JP 2010-129748 A 6/2010
JP 2015-057374 A 3/2015
TW 201203358 A 1/2012
WO 2003/092065 A1 4/2003
WO 2004/008521 A1 1/2004
WO 2005/024918 A1 3/2005

OTHER PUBLICATIONS

International Written Opinion for International Application No. PCT/FR2021/050718 dated Jun. 25, 2021, 5 pages.
Japanese Notice of Reasons for Rejections for Application No. 2022-573309 dated Oct. 1, 2024, 5 pages with English translation.
French Opinion for Application No. 2007096 dated Mar. 2, 2021, 5 pages.
French Search Report for Application No. 2007096 dated Mar. 2, 2021, 2 pages.
International Search Report for Application No. PCT/FR2021/050560 dated Jul. 27, 2021, 2 pages.
International Written Opinion for Application No. PCT/FR2021/050560 dated Jul. 27, 2021, 6 pages.
Taiwanese Office Action for Application No. 11320462890 dated May 8, 2024, 8 pages with English translation.
Japanese First Office Action for Application No. 202180045761.7 dated Sep. 10, 2025, 6 pages.

* cited by examiner

CARRIER SUBSTRATE FOR SOI STRUCTURE AND ASSOCIATED MANUFACTURING METHOD

CROSS-REFERENCE TO RELATED APPLICATIONS

This application is a national phase entry under 35 U.S.C. § 371 of International Patent Application PCT/FR2021/050560, filed Mar. 30, 2021, designating the United States of America and published as International Patent Publication WO 2022/003262 A1 on Jan. 6, 2022, which claims the benefit under Article 8 of the Patent Cooperation Treaty to French Patent Application Serial No. FR2007096, filed Jul. 3, 2020.

TECHNICAL FIELD

The field of the present disclosure is that of semiconductors and microelectronics. It relates to a carrier substrate made of silicon for a silicon-on-insulator (SOI) structure, in particular, for a fully depleted SOI (FD-SOI for fully depleted silicon-on-insulator) structure, suitable for logic and radiofrequency applications. The present disclosure also relates to a process for manufacturing such a carrier substrate.

BACKGROUND

The advantage of FD-SOI technology is already widely documented for radiofrequency and low-power logic applications.

To address the stringent specifications of these applications, the FD-SOI structure has to meet a number of criteria.

First, the very thin working layer (typically on the order of 20 nm) made of silicon has to exhibit excellent uniformity of thickness, and high crystal quality. To achieve this, it has to be able to undergo treatments at high temperatures for long durations, in particular, during production thereof; the treatments are required to smooth the free surface of the working layer and remedy crystal defects present in this layer. This involves the carrier substrate of the SOI structure being resistant to the slip-line failure mode and, in particular, exhibiting a density of micro-defects (BMD for bulk micro-defects) that is sufficient and uniform throughout. These micro-defects are usually present in sufficient quantity in substrates with a high interstitial oxygen content ("high-Oi" substrates), typically corresponding to an Oi concentration higher than 1E18/cm$^3$ (ASTM'79 standard): these high-Oi carrier substrates are particularly robust with respect to slip-line defects.

Second, the SOI structure has to be compatible with very low inspection thresholds, in order to allow the detection of defects smaller than 50 nm in size on and/or in the working layer. It is known that a high-Oi carrier substrate comprises defects called "crystal-originated particles" (COPs) that limit the inspectability of the working layer of the SOI structure; specifically, COP defects located in a surface zone of the carrier substrate, even if they remain below the buried oxide layer of the SOI structure, are detected during the inspection of the working layer at very thorough detection thresholds, due to the penetration of the inspection signal, which will probe slightly below the buried oxide layer. Therefore, a high-Oi carrier substrate is not compatible, as is, with such applications.

Lastly, to meet radiofrequency requirements, the carrier substrate of the SOI structure has to exhibit stable and high resistivity (higher than 500 ohm·cm, than 1000 ohm·cm, or even higher than 5000 ohm·cm). To obtain these properties, it is common practice to use highly resistive carrier substrates with a low Oi content ("low-Oi" substrates, typically corresponding to an Oi concentration lower than 8E17 Oi/cm$^3$), since those with a high Oi content exhibit instability of resistivity at depth, in particular, due to the smoothing heat treatments required for the working layer. Unfortunately, low-Oi carrier substrates are extremely sensitive to lengthy treatments at high temperatures and subsequently exhibit a high density of slip lines detrimental to the SOI structure.

BRIEF SUMMARY

The present disclosure provides a solution that overcomes all or some of the aforementioned drawbacks. In particular, it relates to a carrier substrate that is compatible with the heat treatments imposed on an SOI structure and with the stringent specifications of logic and radiofrequency applications. The present disclosure also relates to a process for producing such a carrier substrate.

The present disclosure relates to a carrier substrate made of monocrystalline silicon, having a front face and a back face and comprising:

- a surface region from the front face down to a depth of between 800 nm and 2 microns, having fewer than ten crystal-originated particles (COPs) detected by inspecting the surface using dark-field microscopy,
- an upper region extending from the front face down to a depth of between a few microns and 40 microns, having an interstitial oxygen (Oi) content lower than or equal to 7.5E17 Oi/cm$^3$ and a resistivity higher than 500 ohm·cm, and
- a lower region extending between the upper region and the back face, having a micro-defect (BMD) concentration higher than or equal to 1E8/cm$^3$.

According to some advantageous features of the present disclosure, taken alone or in any feasible combination:

- the resistivity of the upper region is higher than or equal to 750 ohm·cm, or even higher than or equal to 1000 ohm·cm;
- the upper region extends down to a depth of between 10 microns and 30 microns; and
- the micro-defect (BMD) concentration in the lower region is between 1E8/cm$^3$ and 3E10/cm$^3$, and preferably between 1E9/cm$^3$ and 2E10/cm$^3$.

The present disclosure also relates to an SOI structure comprising a working layer arranged on a dielectric layer, which is itself arranged on a carrier substrate as above.

The working layer may have a thickness of less than 50 nm, preferably of between 4 nm and 25 nm; and the dielectric layer may have a thickness of between 10 nm and 150 nm.

The present disclosure also relates to an electronic component for radiofrequency and low-power logic application, comprising at least one transistor arranged on and/or in the working layer of an SOI structure as above.

Lastly, the present disclosure relates to a process for producing a carrier substrate as mentioned above. The production process comprises the following steps:

a) providing an initial substrate made of monocrystalline silicon, having an interstitial oxygen content of between 12E17 Oi/cm$^3$ and 16E17 Oi/cm$^3$ and a resistivity higher than 500 ohm·cm, the initial substrate being intended to form the carrier substrate after having undergone the subsequent steps b) and c), b) applying a first heat treatment at a temperature of between 1150° C. and 1250° C., under a neutral or reducing atmosphere, for a duration longer than or equal to 30 min, in order to form the surface region and the upper region of the carrier substrate, c) applying a second heat treatment comprising a first sequence of annealing at a temperature of between 600° C. and 900° C., and a second sequence of annealing at a temperature of between 950° C. and 1100° C., in order to form the lower region of the carrier substrate.

Advantageously, the first sequence of the second heat treatment comprises two temperature plateaus, a first plateau between 650° C. and 700° C., and a second plateau around 800° C.

BRIEF DESCRIPTION OF THE DRAWINGS

Other features and advantages of the present disclosure will become apparent from the following detailed description, with reference to the appended figures, in which.

Figure 1:
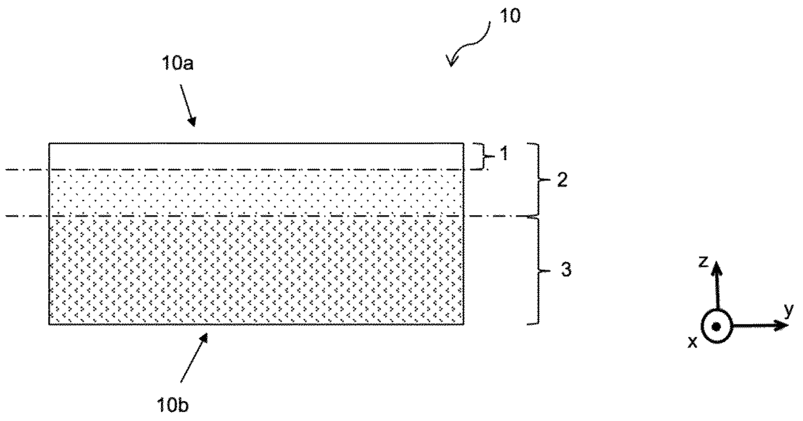
FIG. 1 shows a carrier substrate in accordance with the present disclosure.

In the figures, the same references may be used for elements of the same nature.

The figures are schematic representations that, for the sake of readability, are not to scale. In particular, the thicknesses of the layers along the z-axis are not to scale with respect to the lateral dimensions along the x- and y-axes.

DETAILED DESCRIPTION

The present disclosure relates to a monocrystalline silicon carrier substrate 10, having a front face 10*a* and a back face 10*b*, which are substantially parallel to a main plane (x,y). It is advantageously in the form of a circular wafer, with a diameter of between 200 mm and 450 mm. Its total thickness, along the z-axis normal to the main plane (x,y), may range between a few hundred microns and 1000 microns.

The carrier substrate 10 comprises a surface region 1 from the front face 10*a* down to a depth on the order of a micron, typically between 800 nm and 2 microns. This surface region 1 exhibits the particularity of a very low density of crystal-originated particles (COPs). A straightforward means of detecting these COPs is to use a surface inspection instrument based on dark-field microscopy, usually implemented to measure surface defect density. It is possible to use, for example, an apparatus such as the KLA-Tencor Surfscan® SP2, known in the field of microelectronics. In oblique incidence mode (narrow oblique channel) and with a detection threshold of 44 nm, fewer than ten COPs are detected on the front face 10*a* of a carrier substrate 10 in accordance with the present disclosure.

The carrier substrate 10 comprises an upper region 2 extending from the front face 10*a* down to a depth of between a few microns and 40 microns, preferably down to a depth of between 10 microns and 30 microns. The upper region 2 therefore includes the surface region 1.

The upper region 2 has an interstitial oxygen (Oi) content lower than or equal to 7.5E17 Oi/$cm^3$ (equivalent to a content lower than or equal to 15 ppma according to the ASTM'79 standard). It furthermore has a resistivity higher than 500 ohm·cm, corresponding to a low concentration of p-type dopant (boron). Advantageously, its resistivity is even higher than or equal to 750 ohm·cm, or even higher than or equal to 1000 ohm·cm. The resistivity level is defined according to the target application and the electronic components, which will later be produced on top of the carrier substrate 10. The resistivity ranges of the upper region 2 are particularly suited to radiofrequency components targeting applications in the 30-300 GHz band, involving millimeter wavelengths ("mmWave") and of note, in particular, for supporting the 5G network for next-generation mobile telephones.

The carrier substrate 10 lastly comprises a lower region 3 extending between the upper region 2 and the back face 10*b*, the thickness of which is on the order of a few hundreds of microns. This lower region 3 has a micro-defect (BMD) concentration higher than or equal to 1E8/$cm^3$, which endows it with high mechanical robustness with respect to heat treatments at high temperatures. The micro-defect (BMD) concentration in the lower region 3 is preferably between 1E8/$cm^3$ and 3E10/$cm^3$, and more preferably between 1E9/$cm^3$ and 2E10/$cm^3$.

The lower region 3 has a resistivity that is typically higher than or equal to 250 ohm·cm and potentially fluctuates, which has no real impact on future radiofrequency components since the electromagnetic fields generated by the components do not reach, or only very marginally reach, the lower region 3. Only the resistivity of the upper region 2 has to exhibit a stable and sufficiently high value.

To allow the production of components, a working layer, on or in which the components will be located, has to be transferred onto the carrier substrate 10.

The present disclosure therefore also relates to a silicon-on-insulator (SOI) structure 100 comprising a working layer 30 arranged on a dielectric layer 20, which is itself arranged on a carrier substrate 10 mentioned above (FIG. 2).

The working layer 30 is made of high-quality monocrystalline silicon and has a thickness of less than 50 nm, preferably of between 4 nm and 25 nm. This thickness range is particularly suited to electronic components based on FD-SOI architectures and technologies. The dielectric layer 20, for example, made of silicon oxide, itself has a thickness of between 10 nm and 150 nm.

The presence of the surface region 1 of the carrier substrate 10, exhibiting a very low density of crystal-originated particles (COPs), affords the SOI structure 100 excellent inspectability, at very low detection thresholds (<50 nm). The quality of the working layer 30 may therefore be controlled finely and reliably, without hindrance and/or false detection due to the presence of COPs at the surface 30*a* of the carrier substrate 10.

The present disclosure also relates to an electronic component for radiofrequency and low-power logic application. Such a component comprises, in particular, at least one transistor arranged on and/or in the working layer 30 of the SOI structure 100. The characteristics of the upper region 2 of the carrier substrate 10, namely the resistivity and the low Oi concentration, endow this region with very good insulation performance: specifically, in addition to its high level, the resistivity is also stable in this region 2 because it does not undergo fluctuations due to an overly high Oi concentration, which may generate oxygen thermal donors and small BMDs compensating for the initial p-type doping. The upper region 2 therefore does not undergo any drop or substantial fluctuation in resistivity during heat treatments at high temperatures (>1100° C.) applied to the SOI structure 100. In addition, the high density of micro-defects (BMDs) in the lower region 3 of the carrier substrate 10 endows this substrate with excellent mechanical strength and insensitivity to slip-line defects during the heat treatments.

The present disclosure further relates to a process for producing a carrier substrate 10 as described above.

The production process comprises a step a) of providing an initial substrate 10' made of monocrystalline silicon, having an interstitial oxygen content of between 12E17 Oi/cm$^3$ and 16E17 Oi/cm$^3$ (equivalent to a content of between 24 and 32 ppma as per ASTM'79). It is noted that a substrate with a content of between 24 and 28 ppma (ASTM'79) is usually considered to be a substrate with a medium Oi content ("mid-Oi" substrate); a substrate with a content of between 27 and 32 ppma (ASTM'79) is usually considered to be a substrate with a high Oi content ("high-Oi" substrate).

The initial substrate 10' has a resistivity higher than 500 ohm·cm, i.e., a concentration of p-type dopants (boron) lower than or equal to 2.6E13/cm$^3$. It is intended to form the carrier substrate 10 after having undergone the subsequent steps b) and c) of the process. Thus, the resistivity of the initial substrate 10' is chosen so as to have the required value for the upper region 2 of the carrier substrate 10 according to the target application. Advantageously, the resistivity of the initial substrate 10' is higher than or equal to 750 ohm·cm, or even higher than or equal to 1000 ohm·cm.

During the next step b) of the process, a first heat treatment at a temperature of between 1150° C. and 1250° C., under a neutral or reducing atmosphere, is applied to the initial substrate 10'. The duration of this treatment is longer than or equal to 30 min, for example, between 5 h and 10 h.

The role of this first heat treatment is to dissolve crystal-originated particles (COPs) in a surface region of the initial substrate 10', over a depth of between 800 nm and 2 microns. This leads to the formation of the surface region 1 of the future carrier substrate 10.

The COPs may be dissolved, for example, by rapid thermal annealing (RTA) at a temperature of around 1250° C. for 10 s under a neutral (argon) or reducing (argon and hydrogen) atmosphere, with rapid increase and decrease ramps (50° C./min). Alternatively, annealing in a conventional oven, for example, at 1200° C. for 30 min or 1 h, still under a neutral or reducing atmosphere, also allows the dissolution of the COPs in the surface region 1.

An additional role of the first heat treatment is to exodiffuse interstitial oxygen (Oi) and deplete the initial substrate 10' of Oi in a region from its front face **10*a* down to a greater or lesser depth, depending on the duration of the heat treatment. Typically, for a treatment temperature of 1200° C. and a duration of 10 h, the substrate is Oi-depleted over a depth on the order of 20 microns. This leads to the formation of the upper region 2 of the future carrier substrate 10**.

The first heat treatment may thus comprise either a single anneal, which will perform both of the roles mentioned above, or of a sequence of anneals in the same apparatuses or in different apparatuses, in order to dissolve the COPs and exodiffuse the interstitial oxygen sequentially.

Figure 4:
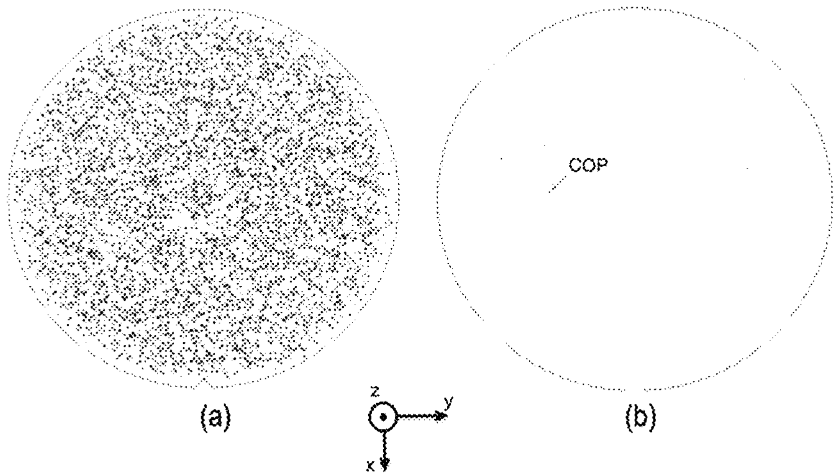
FIG. 4 shows two maps resulting from surface inspection using dark-field microscopy of the surface of an initial substrate (a) not treated with the production process in accordance with the present disclosure, and an intermediate substrate (b) after the first heat treatment of the production process in accordance with the present disclosure.

On conclusion of the first heat treatment, an intermediate substrate 10" that comprises a surface region 1 from the front face **10*a* down to a depth of between 800 nm and 2 microns is obtained. This surface region 1 exhibits a very low density of crystal-originated particles (COPs) as is illustrated in FIG. 4B, in comparison with FIG. 4A, which corresponds to the initial substrate 10' before any treatment. The maps of FIGS. 4A and 4B have been produced using an apparatus such as the KLA-Tencor SP2, in oblique incidence mode and with a detection threshold of 44 nm, on wafers with a diameter of 300 mm: more than 1000 COPs are detected at the front face 10*a* of an initial substrate 10' provided in step a) of the process; after the first heat treatment in step b), fewer than ten COPs, or even fewer than five COPs, are detected at the front face 10*a* of the intermediate substrate 10" (just one COP in the example of FIG. 4**B).

After removal of approximately 1 micron of material from the front face **10*a* of the intermediate substrate 10"**, it is observed that the number of COPs detected remains very low, still lower than or equal to 10. This makes it possible to evaluate the thickness of the surface region 1 with a low COP density.

The intermediate substrate 10" also comprises an upper region 2 extending from the front face **10*a* down to a depth of between a few microns and 40 microns, preferably down to a depth of between 10 microns and 30 microns. The upper region 2 has an interstitial oxygen (Oi) content lower than or equal to 7.5E17 Oi/cm$^3$, depleted with respect to the Oi content of the initial substrate 10' due to the first heat treatment. The resistivity of the upper region 2 is that of the initial substrate 10'**, i.e., higher than 500 ohm·cm. This upper region 2 may be likened to silicon with a low Oi content ("low-Oi" silicon), which endows it with excellent stability in terms of resistivity, even when the substrate is subjected to very high temperatures.

The production process next comprises a step c) during which a second heat treatment is applied to the intermediate substrate 10". This treatment comprises a first sequence of annealing at a temperature of between 600° C. and 900° C., and a second sequence of annealing at a temperature of between 950° C. and 1100° C.

The first annealing sequence comprises two temperature plateaus. A first plateau between 650° C. and 700° C. with a duration of between 30 min and 10 h, under a neutral atmosphere or with a low oxygen flow (typically around 0.075 standard liters per minute (slm) of $O_2$ and around 0.015 slm of $O_2$ in an oven for 300 mm wafers and an oven for 200 mm wafers, respectively). The role of this first plateau is to promote the nucleation of "nucleus" defects, of small size (typically smaller than 10 nm, or even 5 nm), in particular, in the lower region (below the upper region 2) of the intermediate substrate 10", which comprises a high Oi concentration. These nuclei are small $SiO_x$ precipitates, which began either heterogeneously, i.e., on pre-existing defects in the material (vacancies), or homogeneously, i.e., through the migration of oxygen atoms and the formation of $SiO_2$ and $SiO_x$ bonds. They do not form, or do not form significantly, in the Oi-depleted upper region 2. Additionally, even if a small number of nuclei form in the upper region 2, they cannot grow in the second sequence of the second heat treatment (described further on) due to the small amount of Oi, and they will therefore be dissolved.

A second plateau around 800° C., with a duration of between 30 min and 10 h, under a neutral atmosphere or with a low oxygen flow: this allows a second phase of nucleation to be initiated with the formation of other nuclei in the lower region of the intermediate substrate 10", between the first nuclei, and the density thereof thus to be increased. Note that it is possible to use an oxidizing atmosphere (either wet or dry), preferably after half, or even three quarters, of the duration of the second plateau has elapsed.

The second sequence of the second heat treatment, with a duration of between 5 h and 20 h, will then result in the diffusion of the interstitial oxygen Oi and the precipitation thereof on the many nuclei present in the lower region of the intermediate substrate 10", which will make them grow and render them stable in the material. The micro-defects thus created are known as BMDs for bulk micro-defects.

Figure 3A:
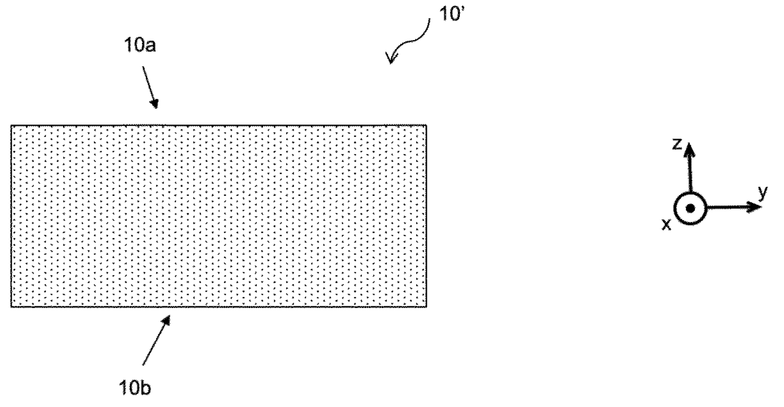
FIGS. 3A-3C show steps of the process for producing the carrier substrate in accordance with the present disclosure.
Figure 3B:
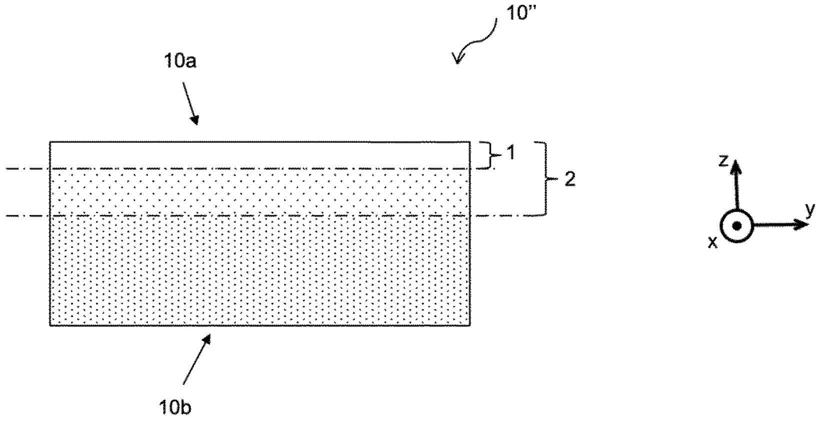
Figure 3C:
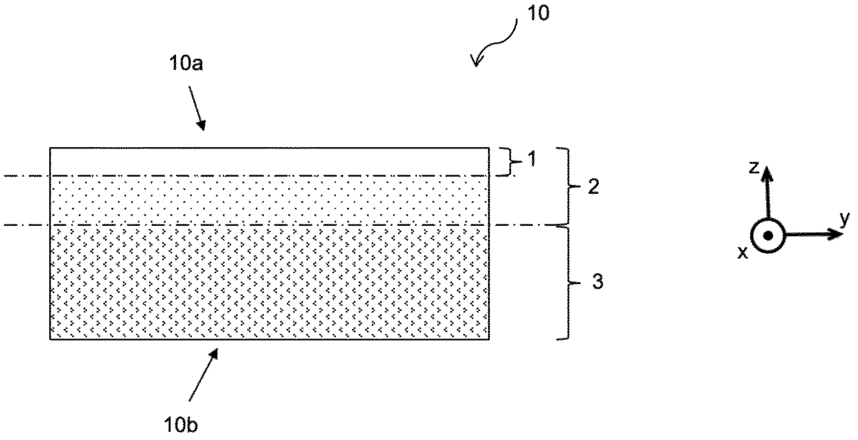
Figure 5:
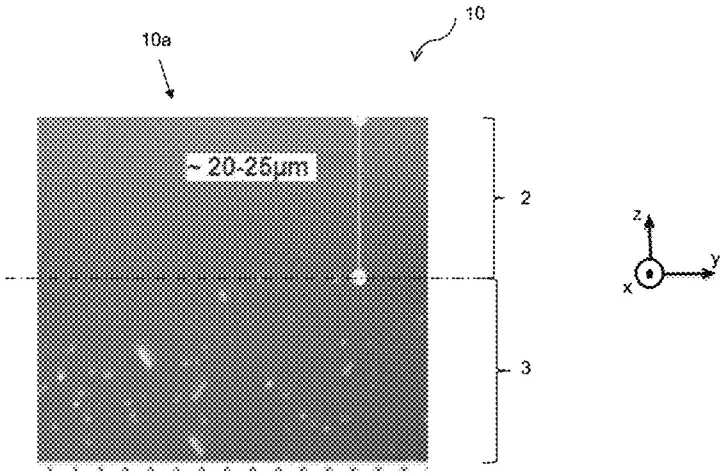
FIG. 5 shows an edge of the carrier substrate in accordance with the present disclosure, after chemically revealing the BMD-type micro-defects.

The lower region 3 of the carrier substrate 10 rich in BMD micro-defects is thus formed (FIG. 3C). In particular, a BMD concentration in the lower region 3 of between $1E8/cm^3$ and $3E10/cm^3$, and preferably between $1E9/cm^3$ and $2E10/cm^3$, is achieved. FIG. 5 corresponds to an optical microscopy image of the edge of a carrier substrate 10 after a chemical etch for revealing the BMD micro-defects: a defect-free zone is observed over a thickness on the order of 20-25 microns in the upper region 2. By contrast, the lower region 3 comprises a high density of BMD defects, on the order of a few $1E9/cm^3$, typically between $2E9/cm^3$ and $5E9/cm^3$ in this example.

Figure 6:
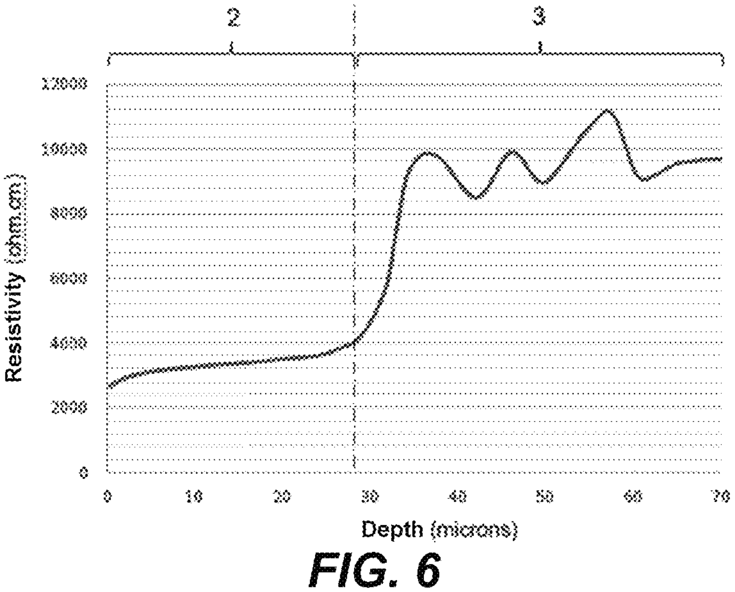
FIG. 6 shows a curve of the resistivity with depth for a carrier substrate in accordance with the present disclosure.

FIG. 6 illustrates a curve of resistivity with depth for a carrier substrate 10 in accordance with the present disclosure. The initial substrate 10' had a resistivity on the order of 3500 ohm·cm and a high Oi content. After the production process of the present disclosure, the carrier substrate 10 has a resistivity that is higher than or equal to 3000 ohm·cm and stable over the first thirty microns (upper region 2). The lower region 3 has a resistivity that is very high and fluctuates, due to the high density of interstitial oxygen. Note that this resistivity may still change during the processes for producing the SOI structure and the microelectronic components, whereas the upper region 2 will retain its resistivity level and its low COP content (surface region 1).

Figure 2:
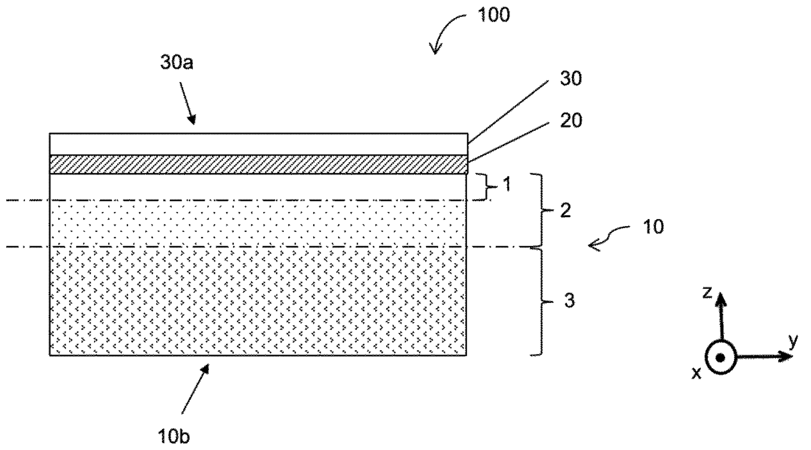
FIG. 2 shows an SOI structure comprising a carrier substrate in accordance with the present disclosure.

Such a carrier substrate 10 may be used in a process for producing an SOI structure 100 such as illustrated in FIG. 2. The production of an SOI structure 100 is preferably based on the thin-layer-transfer process known as the Smart Cut™ process.

A monocrystalline silicon donor substrate is implanted via its front face, so as to define a buried weakened plane substantially parallel to the front face and delimiting therewith the thin layer 30, 20 to be transferred. The implantation is usually done with light species such as hydrogen or helium ions or a combination of these two species. The weakened plane is so named because it comprises nanocracks in lenticular form generated by the implanted light species.

According to one preferred option, the thin layer 30, 20 to be transferred comprises, from the front face of the donor substrate to the buried weakened plane, a dielectric layer 20 and a silicon layer 30, which will form, respectively, the buried dielectric layer 20 and the silicon working layer 30 of the SOI structure 100. It will therefore be understood that the implantation energy for the light species is chosen and adjusted so as to form the buried weakened plane (more or less localized at the implantation peak) at the depth corresponding to the desired thickness of the working layer 30, taking into account finishing steps (mentioned below) that consume part of the material of the layer 30.

The donor substrate and the carrier substrate 10 are then joined, by direct bonding between the front faces of the substrates, to form a bonded assembly. Surface cleaning and/or activation, well known in the field of bonding by molecular adhesion, may be applied to the substrates prior to joining, to obtain excellent bonding quality. Joining in a controlled atmosphere is also possible.

Separation at the buried weakened plane is preferably performed by applying a heat treatment at moderate temperature, typically between 350° C. and 500° C., due to the growth of microcracks by coalescence and pressurization of the gaseous species. Alternatively or in combination, the separation may be brought about by applying a mechanical stress to the bonded assembly.

On conclusion of this separation, an intermediate SOI structure, on the one hand, and the rest of the donor structure, on the other hand, are obtained. Finishing sequences comprising cleaning, surface treatments (etching, polishing, etc.) and/or heat treatments are usually applied to the intermediate SOI structure, and are directed toward removing part of the material of the transferred working layer 30. This makes it possible to restore a good surface state (defect density and roughness) and good crystal quality to the silicon working layer 30. Following this, the SOI structure 100 is available.

The abovementioned finishing heat treatments are usually performed at temperatures of between 900° C. and 1250° C.: the robustness of the lower region 3 of the carrier substrate 10 with respect to defects such as slip lines and other plastic deformations is a significant advantage during these treatments and makes it possible to conserve very good integrity of the SOI structure 100.

Although the production of the SOI structure 100 has been described here with reference to the Smart Cut™ process, such a structure may also be prepared by means of other thin-layer-transfer processes known in the prior art.

RF (for example, "mmWave") electronic components may then be produced on or in the working layer 30, based on, in particular, at least one CMOS (complementary metal-oxide-semiconductor) transistor. Again, the characteristics of the carrier substrate 10 of the SOI structure 100 favor:

- the inspectability of the structure 100 in the various steps for producing the components, by virtue of the presence of the surface region 1 with a very low density of COPs;
- potentially, producing all or some components in the surface region 1, for hybrid SOI/bulk Si integration;
- the mechanical strength of the structure 100 during the multiple sequences of heat treatments at high temperatures implemented in CMOS technologies for producing the components, due to the high density of BMD micro-defects in the lower region 3 of the carrier substrate 10, the region 3 corresponding to the majority of the thickness of the substrate 10. By advantageously targeting a BMD density of between $1E9/cm^3$ and $2E10/cm^3$, slip lines and/or other plastic deformations in the carrier substrate 10, which lead to problems of alignment at the various levels of lithography ("overlay"), are avoided or largely minimized;
- the RF performance of the components, due to the high and stable resistivity of the upper region 2 of the carrier substrate 10: the low Oi content of this region ensures high stability of its resistivity despite the multiple heat treatments; its thickness is suited to the penetration of electromagnetic fields generated by the RF components and prevents them from reaching the lower region 3, the resistivity of which is poorly controlled and potentially at too low a level for the target application.

The electronic components may comprise, in particular, RF switches, power amplifiers (PAs), low-noise amplifiers (LNAs), transmitters/receivers, etc.

Needless to say, the present disclosure is not limited to the embodiments described and implementation variants may be applied thereto without departing from the scope of the invention as defined by the claims.

In particular, the working layer 30 used for producing the components has been described in the context of an SOI structure, thus comprising silicon; but it is entirely conceivable for the working layer 30 to comprise other types of materials, which may or may not be semiconductors. Similarly, the dielectric layer 20 may comprise various types of electrically insulating materials.

The invention claimed is:

1. A carrier substrate comprising monocrystalline silicon and having a front face and a back face, and the carrier substrate further comprising:

a surface region extending from the front face to a depth of between 800 nm and 2 microns, the surface region having fewer than ten crystal-originated particles (COPs);

an upper region extending from the front face to a depth of between a few microns and 40 microns, the upper region having an interstitial oxygen content lower than or equal to 7.5E17 Oi/cm$^3$ and a resistivity higher than 500 ohm·cm; and a lower region extending between the upper region and the back face, the lower region having a micro-defect concentration higher than or equal to 1E8/cm$^3$.

2. The carrier substrate of claim 1, wherein the resistivity of the upper region is higher than or equal to 750 ohm·cm.

3. The carrier substrate of claim 1, wherein the upper region extends to a depth of between 10 microns and 30 microns.

4. The carrier substrate of claim 1, wherein the micro-defect concentration in the lower region is between 1E8/cm$^3$ and 3E10/cm$^3$.

5. A silicon-on-insulator (SOI) structure, comprising: a working layer disposed on a dielectric layer, the dielectric layer disposed on a carrier substrate, the carrier substrate comprising monocrystalline silicon and having a front face and a back face, the carrier substrate further comprising:

a surface region extending from the front face to a depth of between 800 nm and 2 microns, the surface region having fewer than ten crystal-originated particles (COPs);

an upper region extending from the front face to a depth of between a few microns and 40 microns, the upper region having an interstitial oxygen content lower than or equal to 7.5E17 Oi/cm$^3$ and a resistivity higher than 500 ohm·cm; and a lower region extending between the upper region and the back face, the lower region having a micro-defect concentration higher than or equal to 1E8/cm$^3$.

6. The SOI structure of claim 5, wherein the working layer has a thickness of less than 50 nm.

7. The SOI structure of claim 5, wherein the dielectric layer has a thickness of between 10 nm and 150 nm.

8. An electronic component for radiofrequency or low-power logic application, comprising:

a silicon-on-insulator (SOI) structure including a working layer disposed on a dielectric layer, the dielectric layer disposed on a carrier substrate, the carrier substrate comprising monocrystalline silicon and having a front face and a back face, the carrier substrate further comprising:

a surface region extending from the front face to a depth of between 800 nm and 2 microns, the surface region having fewer than ten crystal-originated particles (COPs);

an upper region extending from the front face to a depth of between a few microns and 40 microns, the upper region having an interstitial oxygen content lower than or equal to 7.5E17 Oi/cm$^3$ and a resistivity higher than 500 ohm·cm; and a lower region extending between the upper region and the back face, the lower region having a micro-defect concentration higher than or equal to 1E8/cm$^3$; and at least one transistor disposed on and/or in the working layer of the SOI structure.

9. A method for manufacturing a carrier substrate, the method comprising:

a) providing a substrate comprising monocrystalline silicon, the substrate having an interstitial oxygen content between 12E17 Oi/cm$^3$ and 16E17 Oi/cm$^3$ and a resistivity higher than 500 ohm·cm;

b) applying a first heat treatment at a temperature between 1150° C. and 1250° C., under a neutral or reducing atmosphere, for a duration longer than or equal to 30 min, to form a surface region and an upper region in the substrate, the surface region extending from a front face of the substrate to a depth of between 800 nm and 2 microns, the surface region having fewer than ten crystal-originated particles (COPs), the upper region extending from the front face to a depth of between a few microns and 40 microns, the upper region having an interstitial oxygen content lower than or equal to 7.5E17 Oi/cm$^3$ and a resistivity higher than 500 ohm·cm; and c) applying a second heat treatment comprising a first sequence of annealing at a temperature between 600° C. and 900° C., and a second sequence of annealing at a temperature between 950° C. and 1100° C., to form a lower region in the substrate, the lower region extending between the upper region and a back face of the substrate, the lower region having a micro-defect concentration higher than or equal to 1E8/cm$^3$.

10. The method of claim 9, wherein the first sequence of the second heat treatment comprises two temperature plateaus including a first plateau between 650° C. and 700° C., and a second plateau around 800° C.

11. The carrier substrate of claim 2, wherein the resistivity of the upper region is higher than or equal to 1000 ohm·cm.

12. The carrier substrate of claim 4, wherein the micro-defect concentration in the lower region is between 1E9/cm$^3$ and 2E10/cm$^3$.

13. The SOI structure of claim 6, wherein the working layer has a thickness of between 4 nm and 25 nm.

* * * * *